United States Patent
Kant et al.

(10) Patent No.: US 10,429,749 B2
(45) Date of Patent: Oct. 1, 2019

(54) METHOD OF REDUCING EFFECTS OF RETICLE HEATING AND/OR COOLING IN A LITHOGRAPHIC PROCESS

(71) Applicant: ASML NETHERLANDS B.V., Veldhoven (NL)

(72) Inventors: Nick Kant, Utrecht (NL); Mark Jan Hendrik Luttikhof, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 15/760,629

(22) PCT Filed: Aug. 26, 2016

(86) PCT No.: PCT/EP2016/070157
§ 371 (c)(1),
(2) Date: Mar. 15, 2018

(87) PCT Pub. No.: WO2017/050523
PCT Pub. Date: Mar. 30, 2017

(65) Prior Publication Data
US 2018/0259859 A1    Sep. 13, 2018

(30) Foreign Application Priority Data

Sep. 24, 2015  (EP) ..................... 15186673
Nov. 30, 2015  (EP) ..................... 15196964
May 18, 2016   (EP) ..................... 16170061

(51) Int. Cl.
G03B 27/52    (2006.01)
G03F 7/20     (2006.01)

(52) U.S. Cl.
CPC .......... *G03F 7/70875* (2013.01); *G03F 7/705* (2013.01); *G03F 7/70516* (2013.01); *G03F 7/70783* (2013.01)

(58) Field of Classification Search
CPC .. G03F 7/70875; G03F 7/705; G03F 7/70783; G03F 7/70866; G03F 7/70483;
(Continued)

(56) References Cited

U.S. PATENT DOCUMENTS 6,784,977 B2    8/2004  Bunau et al.
7,262,831 B2    8/2007  Akhssay et al.
(Continued)

FOREIGN PATENT DOCUMENTS

CN    102768474    11/2012
JP    S63115203    5/1988
(Continued)

OTHER PUBLICATIONS

Japanese Office Action issued in corresponding Japanese Application No. 2017-526086, dated May 28, 2018, with English translation, 18 pages.
(Continued)

*Primary Examiner* — Christina A Riddle
(74) *Attorney, Agent, or Firm* — Pillsbury Winthrop Shaw Pittman LLP

(57) ABSTRACT

A method of reducing effects of reticle heating and/or cooling in a lithographic process, the method including calibrating a linear time invariant reticle heating model using a system identification method; predicting distortions of the reticle using the reticle heating model and inputs in the lithographic process; and calculating and applying a correction in the lithographic process on the basis of the predicted distortions of the reticle.

20 Claims, 4 Drawing Sheets

(58) Field of Classification Search
CPC ............ G03F 7/70491; G03F 7/70516; G03F 7/70525; G03F 7/70533; G03F 7/70591; G03F 7/706; G03F 7/70633; G03F 7/70558; G03F 7/7075; G03F 7/70725; G06F 17/5009; G06F 17/15; G06F 17/153; G06F 17/156
USPC ............... 355/30, 52, 53, 55, 67–71, 75–77; 250/492.1, 492.2, 492.22, 493.1, 548; 430/5, 22, 311; 702/130, 136, 131; 716/115; 700/28, 29–31, 47
See application file for complete search history.

(56) References Cited

U.S. PATENT DOCUMENTS

| | | | |
|---|---|---|---|
| 7,289,858 | B2 | 10/2007 | Van Donkelaar et al. |
| 7,403,264 | B2 | 7/2008 | Jeunink et al. |
| 7,421,358 | B2 | 9/2008 | Tuohy |
| 7,580,113 | B2 | 8/2009 | Tel et al. |
| 8,175,831 | B2 | 5/2012 | Izikson et al. |
| 8,184,265 | B2 | 5/2012 | Wardenier |
| 8,203,696 | B2 | 6/2012 | Bittner et al. |
| 8,482,718 | B2 | 7/2013 | Corbeij et al. |
| 8,741,510 | B2 | 6/2014 | Takahashi et al. |
| 9,417,533 | B2 | 8/2016 | Prosyentsov et al. |
| 9,513,564 | B2 | 12/2016 | Ozawa |
| 2002/0111038 | A1 | 8/2002 | Matsumoto et al. |
| 2002/0191165 | A1 | 12/2002 | Baselmans et al. |
| 2003/0002023 | A1 | 1/2003 | Bunau et al. |
| 2005/0167514 | A1 | 8/2005 | Kaushal et al. |
| 2005/0267609 | A1 | 12/2005 | Van Donkelaar et al. |
| 2006/0008716 | A1 | 1/2006 | Jeunink et al. |
| 2006/0114437 | A1 | 6/2006 | Akhssay et al. |
| 2006/0256836 | A1* | 11/2006 | Hutter ................. G01D 1/00 374/43 |
| 2007/0177135 | A1 | 8/2007 | Tuohy |
| 2007/0291243 | A1 | 12/2007 | Suzuki |
| 2007/0296938 | A1 | 12/2007 | Tel et al. |
| 2008/0286885 | A1 | 11/2008 | Izikson et al. |
| 2009/0225293 | A1 | 9/2009 | Shigenobu et al. |
| 2009/0231568 | A1 | 9/2009 | Fukuhara |
| 2009/0323039 | A1 | 12/2009 | Wardenier |
| 2011/0043780 | A1 | 2/2011 | Corbeij et al. |
| 2011/0181855 | A1 | 7/2011 | Bittner et al. |
| 2012/0120379 | A1 | 5/2012 | Phillips et al. |
| 2012/0133914 | A1 | 5/2012 | Prosyentsov et al. |
| 2013/0060354 | A1 | 3/2013 | Choi et al. |
| 2013/0137050 | A1 | 5/2013 | Takahashi et al. |
| 2014/0204353 | A1 | 7/2014 | Ozawa |
| 2015/0049315 | A1 | 2/2015 | Hoshino |

FOREIGN PATENT DOCUMENTS

| | | |
|---|---|---|
| JP | 2002073111 | 3/2002 |
| JP | 2002334835 | 11/2002 |
| JP | 2003-124110 | 4/2003 |
| JP | 2005526388 | 9/2005 |
| JP | 2006-024941 | 1/2006 |
| JP | 2006-157020 | 6/2006 |
| JP | 2006332168 | 12/2006 |
| JP | 2007157824 | 6/2007 |
| JP | 2007-250723 | 9/2007 |
| JP | 2009513944 | 4/2009 |
| JP | 2009205641 | 9/2009 |
| JP | 2009282926 | 12/2009 |
| JP | 2012503870 | 2/2012 |
| JP | 2012119680 | 6/2012 |
| JP | 2013-115348 | 6/2013 |
| WO | 2007123189 | 1/2007 |

OTHER PUBLICATIONS

International Search Report and Written Opinion dated Dec. 23, 2016 in corresponding International Patent Application No. PCT/EP2016/070157.

Verhagen, Michel et al., "Chapter 10: The System-Identification Cycle", Filtering and System Identification: A Least Squares Approach, pp. 345-394 (2007).

Verhagen, Michel et al., "Subspace model identification Part 1. The output-error state-space model identification class of algorithms", International Journal of Control, vol. 56, No. 5, pp. 1187-1210, (1992).

Van Overschee, Peter et al., "Chapter 4: Combined Deterministic-Stochastic Identification", Subspace Identification for Linear Systems, pp. 95-134 (1996).

Verhagen, Michel et al., "Chapter 5: Kalman Filtering", Filtering and System Identification: A Least Squares Approach, pp. 126-177 (2007).

Verhagen, Michel et al., "Chapter 8: Prediction-error Parametric Model Estimation", Filtering and System Identification: A Least Squares Approach, pp. 254-291 (2007).

Verhagen, Michel et al., "Chapter 9: Subspace Model Identification", Filtering and System Identification: A Least Squares Approach, pp. 292-344 (2007).

El-Awady, Khalid et al., "Programmable thermal processing module for semiconductor substrates", IEEE Transactions on Control Systems Technology, vol. 12, No. 4, pp. 493-509 (2004).

Bikcora, Can et al., "Thermal Deformation Prediction in Reticles for Extreme Ultraviolet Lithography Based on a Measurement-Dependent Low-Order Model", IEEE Transactions on Semiconductor Manufacturing, vol. 27, No. 1, pp. 104-117 (2014).

U.S. Office Action issued in corresponding U.S. Appl. No. 15/527,254, dated Aug. 30, 2018.

Japanese Office Action issued in corresponding Japanese Patent Application No. 2017-526086, dated Jan. 15, 2019.

U.S. Office Action issued in corresponding U.S. Appl. No. 15/527,254, dated Mar. 14, 2019.

U.S. Office Action issued in corresponding U.S. Appl. No. 16/458,601, dated Aug. 12, 2019.

* cited by examiner

METHOD OF REDUCING EFFECTS OF RETICLE HEATING AND/OR COOLING IN A LITHOGRAPHIC PROCESS

CROSS-REFERENCE TO RELATED APPLICATIONS

This application is the U.S. national phase entry of PCT patent application no. PCT/EP2016/070157, which was filed on Aug. 26, 2016, which claims the benefit of priority of European patent EP application no. 15186673.8, which was filed on Sep. 24, 2015, and European patent EP application no. 15196964.9, which was filed on Nov. 30, 2015, and European patent application no. 16170061.2, which was filed on May 8, 2016, and which are incorporated herein in their entirety by reference.

BACKGROUND

Field of the Invention

The present invention relates to a method of reducing effects of reticle heating and/or cooling in a lithographic process, in particular the effects of reticle heating and/or cooling on imaging performance, e.g. overlay and/or focus. The present invention further relates to a computer program to carry out such method, a computer readable medium carrying such computer program, a lithographic apparatus and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, a radiation beam is used to project a desired pattern from the reticle onto the substrate. The dose of radiation that is received by the reticle causes heating of the reticle. This heating causes thermal expansion and as a result the shape of the reticle may change, therewith adversely affecting imaging performance, e.g. overlay and/or focus, of the lithographic process.

In a known embodiment of a lithographic apparatus, a finite elements method model (FEM model) is used to model the effects of heating of a reticle on imaging performance on a lithographic process. The output of this FEM model can be used to improve overlay and/or focus by adjusting positioning of the reticle with respect to the substrate during the actual projection of the patterned beam on the substrate.

With increasing demands on imaging performance of a lithographic apparatus, the complexity of the FEM model increases in order to effectively adjust the effects of reticle heating in imaging performance. Moreover, there is a need to cool the reticle with a reticle cooling system to cool the reticle below a certain temperature. The cooling provided by the reticle cooling system and its effect on reticle shape further increases the complexity of the FEM model.

The increasing complexity of the FEM model results in an increasing numerical effort to calculate the effect of reticle heating and/or cooling on overlay and/or focus. This may result in that the calculation of the effect of the reticle heating and/or cooling is not fast enough to use the result for adjustment of the positioning of the reticle and substrate with respect to each other for subsequent substrates.

SUMMARY

It is desirable to provide a method to reduce the effects of reticle heating and/or cooling in a lithographic process, in particular the effects of reticle heating and/or cooling on imaging performance, e.g. overlay and/or focus. In particular, it is desirable to provide such method which allows calculating the effects of reticle heating and/or cooling with a relatively low numerical effort.

According to an embodiment of the invention, there is provided a method of reducing effects of reticle heating and/or cooling in a lithographic process, comprising the steps of: calibrating a linear time invariant reticle heating model using a system identification method;

predicting distortions of the reticle using the reticle heating model and inputs in the lithographic process; and calculating and applying a correction in the lithographic process on the basis of the predicted distortions of the reticle.

According to an embodiment of the invention, there is provided a computer program comprising computer readable instruction configured to cause a processor to carry out a method as described above.

According to an embodiment of the invention, there is provided a computer readable medium carrying a computer program as described above.

According to an embodiment of the invention, there is provided a lithographic apparatus comprising:
an illumination system configured to condition a radiation beam;
a support constructed to support a reticle, the reticle being capable of imparting the radiation beam with a pattern in its cross-section to form a patterned radiation beam;
a substrate support constructed to support a substrate; and
a projection system configured to project the patterned radiation beam onto a target portion of the substrate,
wherein the lithographic apparatus comprises a control system arranged to reduce effects of reticle heating and/or cooling in a lithographic process, by calibrating a linear time invariant reticle heating model using a system identification method;

predicting distortions of the reticle using the reticle heating model and inputs in the lithographic process; and calculating and applying a correction in the lithographic process on the basis of the predicted distortions of the reticle.

According to an embodiment of the invention, there is provided a device manufacturing method using a lithographic process comprising:

patterning a projection beam with a pattern in its cross-section using a reticle;

projecting the patterned beam of radiation onto a target portion of a substrate using a projection system, wherein the method further comprises the steps of:

calibrating a linear time invariant reticle heating model using a system identification method;

predicting distortions of the reticle using the reticle heating model and inputs in the lithographic process; and calculating and applying a correction in the lithographic process on the basis of the predicted distortions of the reticle.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
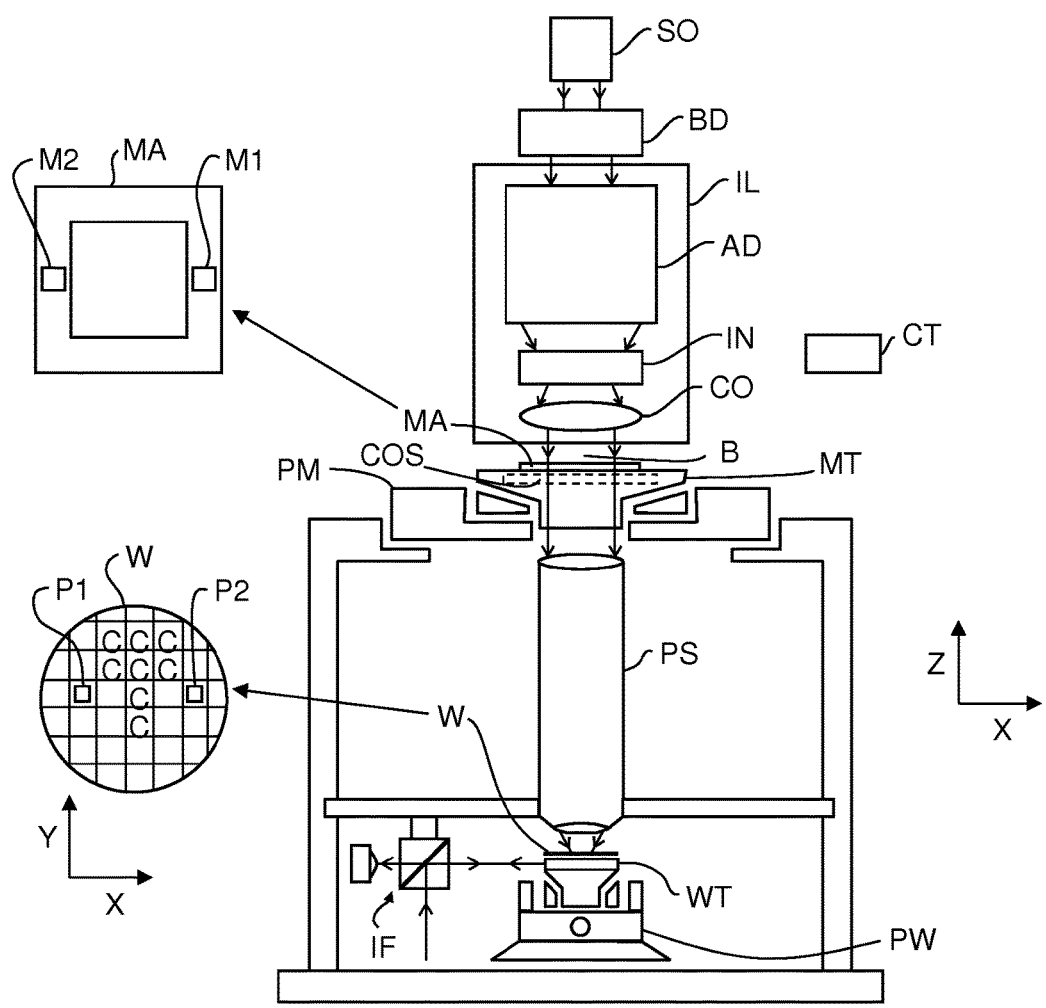
FIG. 1 depicts schematically a lithographic apparatus comprising a substrate stage according to an embodiment of the invention.

DETAILED DESCRIPTION a FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate W. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. In addition to one or more substrate supports, the lithographic apparatus may have a measurement stage provided with at least one sensor to measure a property of the substrate support or a property of the radiation beam exiting the projection system. The measurement stage may be arranged not to hold a substrate.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device MA, which is held on the mask support structure MT, and is patterned by the patterning device MA. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks may be located between the dies.

The depicted apparatus could be used in at least one of the following modes:

1. In step mode, the mask support structure MT and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask support structure MT and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask support structure MT is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus comprises a controller CT that is configured to control at least positioning of the substrate W with respect to the reticle MA during the projection of the patterned radiation beam B onto the substrate W.

The radiation beam B that is used to project a desired pattern from the reticle MA onto the substrate W causes heating of the reticle MA. As a result of this heating, the shape of the reticle MA may change, in particular distortions of the reticle MA may occur. Also, cooling of the reticle by a reticle cooling system COS may also cause distortion in the reticle MA. These distortions may adversely affect imaging performance, e.g. overlay and/or focus, of the lithographic process.

In accordance with the invention, a linear time invariant reticle heating model is used in the controller CT to predict distortions of the reticle based on inputs into the lithographic process over time. On the basis of the predicted distortions of the reticle a correction is calculated and applied in the lithographic process, in particular to improve imaging performance of the lithographic process.

In an embodiment, the reticle heating model may be used in an observer to optimally track a reticle heating signal, if one is available. With this observer reduced noise on the original reticle heating signal can be obtained.

Moreover, the observer can be used for badly conditioned reticles, thus reticles that have another temperature than the ambient temperature when placed on the reticle support. With the observer and a model of how a badly conditioned reticle behaves, which could also be identified during calibration of the reticle heating model, the distortions caused by this effect can be predicted.

Figure 2:
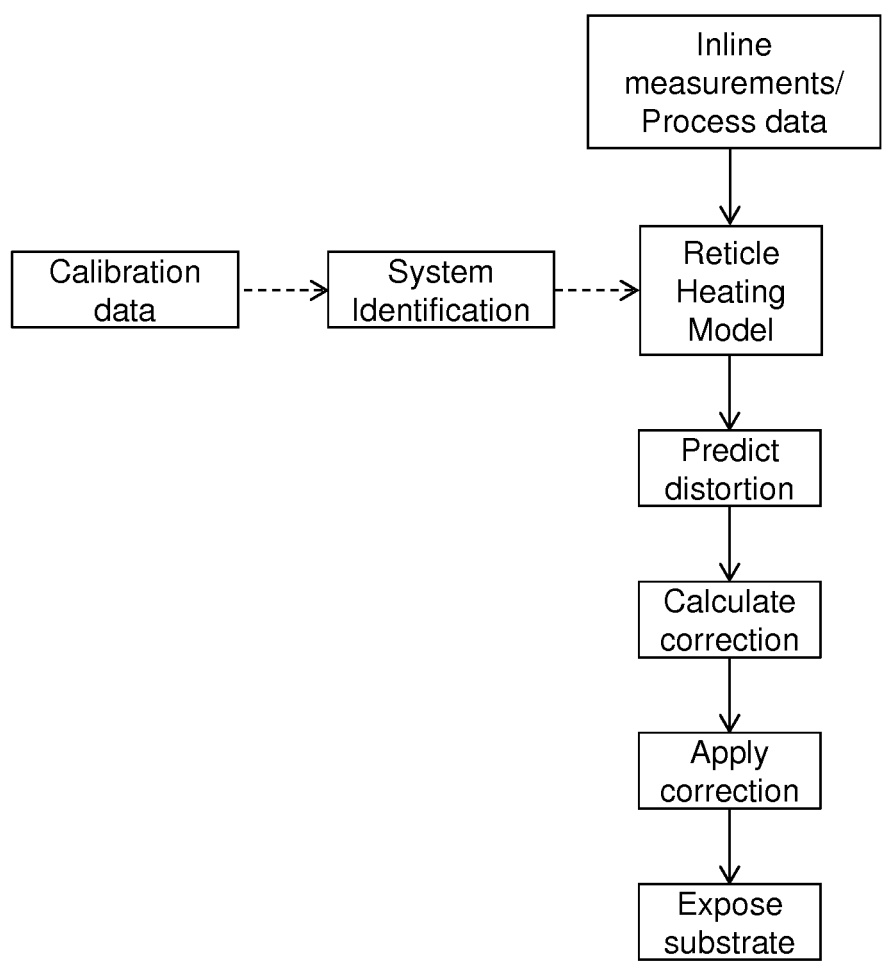
FIG. 2 shows a scheme of the application of a reticle heating model according to the invention.

FIG. 2 shows a scheme of the application of the reticle heating model. The reticle heating model comprises relationships between inputs, in particular inputs having effect on the heating and/or cooling of the reticle, and resulting distortions of the reticle.

These inputs may for example comprise the dose of radiation supplied by the radiation source SO and/or the illuminator IL, area size of the reticle that is being exposed, the irradiance and/or a transmission of the reticle and a cooling dose supplied by an adaptive reticle cooling system COS (FIG. 1). Inputs may be known from process data, in particular actual inputs of the lithographic process provided by the controller CT or in-line measurements by sensors within the lithographic apparatus LA.

On the basis of the inputs, the reticle heating model is configured to predict distortions of the reticle. This predicted distortions can be used to calculate a correction of the positioning of the substrate W with respect to the reticle MA. This correction can be taken into account in positioning of the substrate table WT with respect to the reticle support MT during the projection of the pattern of the reticle MA on the substrate W such that the alignment of the substrate W with respect to the reticle is improved.

It is remarked that although correction of the alignment of the substrate W with respect to the reticle MA provides a suitable way to correct the effect of distortions on the overlay performance of the lithographic apparatus, any other way of improving the imaging performance may also be applied. For example, the calculated correction may be used to adjust the lens parameters of the projection system PS to improve the imaging performance on the basis of the predicted distortions of the reticle by the reticle heating model. Also, the reticle heating model may be used to predict distortions of the reticle that have a negative effect on the focus performance of the lithographic apparatus, in particular distortions in a z-direction perpendicular to a main plane of the reticle. By calculating and applying a correction in the lithographic process on the basis of the predicted distortions of the reticle in the z-direction, the effects of the actual distortion on the imaging performance, can at least partially be compensated therewith improving imaging performance, in particular focus performance in the lithographic process.

The advantage of the method of the invention is that the reticle heating model is used as a predictor to predict the distortions of the reticle, whereby noise can be effectively filtered out. It has been found that a reticle heating model of third, fourth or fifth order may be sufficiently accurate to be used as an predictor to actually improve imaging performance of the lithographic apparatus. This also depends on the decomposition that is used on the distortion measurements, and the amount of detail that is inserted in the reticle heating model. With increasing demands on imaging performance, a model of higher order may be used to meet these increasing demands, for example $1^{st}$ order, $2^{nd}$ order and $6^{th}$ order up to $100^{th}$ order.

The reticle heating model is configured to take into account the effects of heating and/or cooling of the reticle on the distortion of the reticle. In this model there may be a constant cooling by the reticle cooling system.

The reticle heating model may also be configured to take into account adaptive cooling by the cooling system. In an adaptive cooling system, the amount of cooling energy provided to the reticle is not constant over time, but is made dependent on certain process parameters, for example reticle temperature. Such reticle heating model also comprises a relationship between the cooling dose, i.e. the amount of cooling energy supplied to the reticle cooling system, as an input and the distortion of the reticle MA caused by this cooling.

The distortion of the reticle may for example be expressed in overlay/focus parameters and/or mode shapes. In overlay/focus parameters, the distortion is determined for each location on the reticle. When using mode shapes, typical deformation shapes of the reticle caused by heating and/or cooling of the reticle are used to determine the distortion at a particular position of the reticle. Any other expression representative for the distortion at a specific location of the reticle may also be applied.

The correction provided by the control system CT can be applied in any suitable way to improve the overlay performance of the lithographic apparatus. The correction may for example be applied before a batch of substrates being radiated with a pattern of a specific reticle MA, and/or between two subsequent substrates W of such batch being processed in the lithographic apparatus. It is also possible to apply a correction during the projection of a patterned radiation beam B onto a substrate W.

Figure 3:
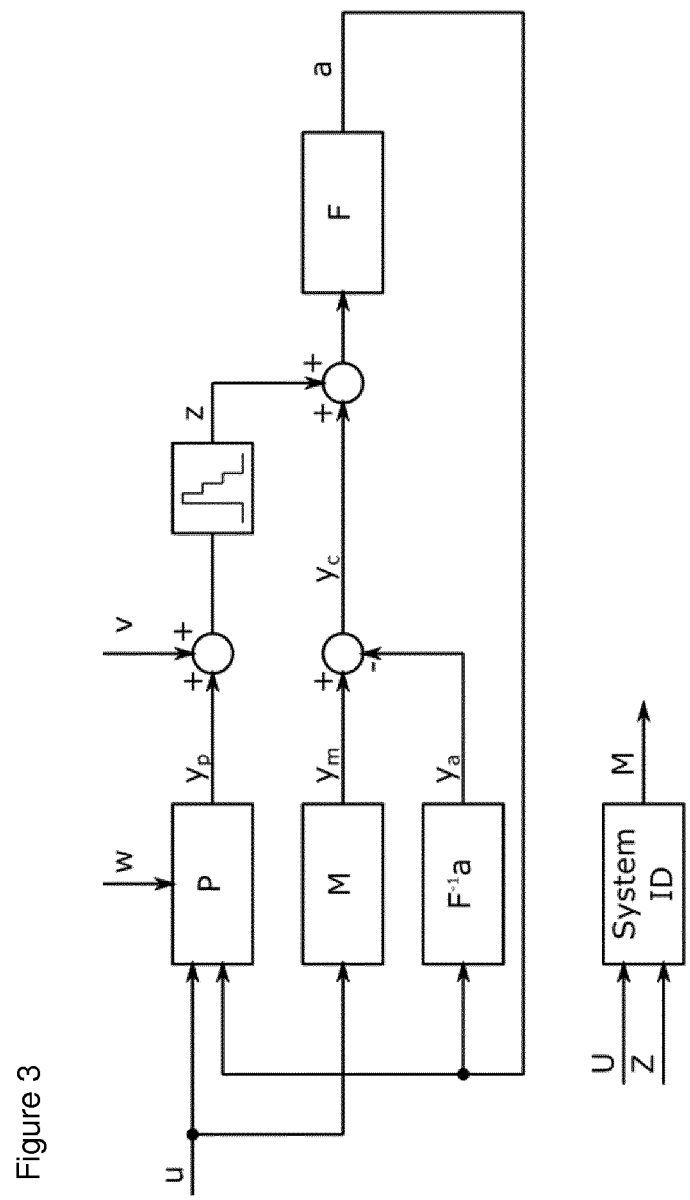
FIG. 3 shows a control scheme of an embodiment of a control strategy using a reticle heating model.

FIG. 3 shows a control scheme of the control strategy for reticle heating compensation using the reticle heating model as a predictor to predict distortions of the reticle.

The exposure system can be described as:

$$\dot{x}=Ax=Bu+w$$

$$z=Cx+Du+F^{-1}a+v,$$

wherein x is the state of the system, in particular temperature, A, B, C and D are system matrices and form the linear time invariant state space system, z are measured distortions caused by reticle heating, F is a transformation matrix that transform an adjustment "a" into a correction, u are inputs, such as radiation dose, transmission, etc., v is measurement noise, and w is process noise. The reticle heating model can be described as:

$$\dot{\hat{x}}=\hat{A}\hat{x}=\hat{B}u$$

$$y_C=\hat{C}\hat{x}+\hat{D}u-F^{-1}a$$

wherein x is the state of the model, $\hat{A}$, $\hat{B}$, $\hat{C}$, $\hat{D}$ are estimates of the real system matrices using system identification, $y_c$ is the reticle heating prediction minus the corrections applied by alignment strategies, F is the transformation matrix that transforms an adjustment "a" into a correction, and u are inputs, such as radiation dose, transmission, etc. As shown in FIG. 3, the reticle heating model M is used to determine the distortion of the reticle. In order to correct the effects of the distortion an adjustment a is applied. This adjustment a is:

$$a=F(z+y_C)$$

The reticle heating model is a linear time invariant state space model, which can be calibrated by a system identification method, for example a subspace identification method as described below. At the bottom of FIG. 3, the calibration of the reticle heating model M is schematically shown. The system identification method is carried out using input data over time U and output data over time Z.

The input data over time comprises a time series of inputs that excite the system. The output data over time comprises associated time series of imaging performance related parameters, such as overlay and/or focus measurements and/or modal amplitudes of fitted modes shapes on the measurement data. The input data and output data over time are selected to be used to identify the reticle heating model by a system identification method.

The output data may be based on measurements. In addition, or as an alternative, the output data may comprise output information obtained from another model describing the relationship between input and output, for example a FEM model describing the distortion caused by reticle heating and/or cooling.

Calibration of the reticle heating model is typically performed for each reticle MA or type or group of reticles MA having a corresponding distortion behavior to optimize the reticle heating model for that reticle MA or type or group of reticles MA. Reticles may show, for example dependent on the pattern on the reticle, different distortion behavior.

The calibration of the reticle heating model may be improved when the reticle heating model is specifically calibrated for a single reticle MA. Alternatively, for specific types or groups of reticles MA having substantially the same distortion behavior a single calibration of the reticle heating model may be sufficient to effectively predict the distortions of the reticle, in particular the distortion caused by heating and/or cooling.

The reticle heating model is generated using a data-driven approach. In this approach the form of the model is driven by the data itself, and the result is a "black-box model". The model is generated during a calibration phase using input data and measured or model based calculated distortions of a reticle. System identification is used to generate a linear time invariant model which, starting from the input data, outputs distortions that match the measured distortions. In other words, the model correlates the inputs to the measured distortions. An advantage of this data driven approach is that it is capable of capturing unknown phenomena of the reticle behavior instead of merely attempting to model the effect of known phenomena in a FEM model.

Identification of the reticle heating model will now be described. The reticle heating model is a linear time invariant (LTI) model. The signal generating system, e.g. a measurement setup that measures the reticle deformation caused by reticle heating can be expressed as a linear time invariant model in state space form in the following way:

$$x(k+1)=Ax(k)+Bu(k)+w(k) \quad (1)$$

$$y(k)=Cx(k)+Du(k)+v(k) \quad (2)$$

where x is the state vector (i.e. a vector indicative of the state of the reticle heating), u is a vector which represents inputs, y is a vector which represents the output (i.e. the distortions caused by the reticle heating), w represents process noise, v represents measurement noise, and k is the sample index. The noise sequences are assumed to be zero-mean white-noise (constant power spectrum) signals that are uncorrelated to the inputs.

The identification is intended to find system matrices A, B, C and D, the initial state of the system x0, and the joint covariance matrix:

$$E\left[\begin{bmatrix} v(k) \\ w(k) \end{bmatrix} [v(j)^T \ w(j)^T]\right] = \begin{bmatrix} R & S^T \\ S & Q \end{bmatrix} \quad (3)$$

where R is the co-variance matrix for the outputs, Q is the co-variance matrix for the states, S signifies the coupling between the different states and outputs and j is also a sample index. The joint covariance matrix is applied when the reticle heating model is used to calculate an observer, e.g. used to calculate the Kalman gains. The initial state x0 is used during validation of the model to compare the predictions of the model with measured data.

System identification methods, for example sub space identification methods can be used to identify the model. Sub space identification methods are based on the fact that, by storing the input and output data in structured block Hankel matrices, it is possible to retrieve certain subspaces that are related to the system matrices of the signal generating system. With these methods estimates are found of the real system matrices A, B, C and D up to an unknown similarity transformation T. Since the similarity transformation T is unknown, the following system matrices are estimated:

$$A_T=T^{-1}AT, B_T=T^{-1}B, C_T=CT, D_T=D \quad (4)$$

Estimating these parameters results in a black-box model representing the internal workings of the model. The model does not have to represent the actual physical effects.

The A, C matrices and the joint covariance matrices are calculated using Canonical Variate Analysis (CVA). The CVA may be implemented in the manner described in V. Overchee and B. Moor, Subspace identification for linear systems. Kluwer Academic Publishers, Dordrecht, Holland, 1996. Other methods may also be used to calculate the A, C matrices and the joint covariance matrix, for example Multivariable Output-Error State-sPace (MOESP) or Numerical algorithm for Subspace IDentification (N4SID). The MOESP algorithm may be implemented in the manner described in M. Verhaegen and V. Verdult, Filtering and System Identification. Cambridge University Press, 2007. Cambridge Books Online. The MOESP provides results which are very similar to results obtained using the CVA method. Alternatively other methods such as output error methods (OE) or prediction error methods (PEM) can be used.

The B and D matrices are also calculated. A first method of performing this calculation is based on the fact that the output can be expressed linearly in the matrices B, D and the vector x0 as $$\hat{y}(k)=CA^kx_0+(\Sigma_{\tau=0}^{k-1}u(t)\otimes CA^{k-\tau-1})\text{vec}(B)+(u(k)^T\otimes I_l)\text{vec}(D) \quad (5)$$

where l is the number of outputs, $\otimes$ is the Kronecker product and the vec operator stacks all the columns of a matrix on top of each other in one big vector. This linear expression makes it possible to use a least squares method to minimize the error.

$$\min_{x_0,B,C} \frac{1}{N}\Sigma_{k=0}^{N-1} \| y(k) - \hat{y}(k) \|_2^2 \quad (6)$$

where $\hat{y}(k)$ is the prediction of the model with the already estimated A and C matrices.

A second method extracts the B and D matrices from a part of RQ factorization used in the calculation of A and C (RQ factorization is a standard factorization technique in linear algebra and is thus not described here). This method is described in V. Overchee and B. Moor, Subspace identification for linear systems. Kluwer Academic Publishers, Dordrecht, Holland, 1996, and is also described in M. Verhaegen and P. Dewilde, "Subspace model identification part 1. the output-error state-space model identification class of algorithms," International journal of control, vol. 56, no. 5, pp. 1187-1210, 1992. By applying this method, the use of Equation (5) is avoided, which significantly may, in certain cases, improve numerical performance for a large dataset. However, this method does not take the initial state x0 into account, and this may be the cause of less accurate calculation of B and D in comparison with the other method of calculating B and D.

It is desirable to capture in the reticle heating model all the effects of influences on the reticle. In addition, it is desirable to capture all the effects of influences on the measurement setup (i.e. effects on measurement values which arise from the way in which the measurement is performed rather than from distortions caused by the reticle heating). In an embodiment, data which may be used as inputs during generation of the reticle heating model is as follows:

Dose and mask transmission—The amount of energy supplied to the reticle is dependent on the dose supplied by the radiation source and the amount of light transmitted by the reticle MA. The dose may for example have a range of 3-50 mJ/cm$^2$ in the dataset. The transmission may for example have a value between 0% and 100%.

Power—The power of radiation applied to the reticle from the illumination system. The power is a combination of the dose of radiation, the transmission of the reticle, and the area that is illuminated by the radiation. The power input may be in the form of a step sequence with the gain of the step equal to the corresponding power.

These inputs are used for the identification procedure used to identify the reticle heating model. In this embodiment the data set used to generate the reticle heating model is obtained during operation of the lithographic apparatus. The data set may be generated by exposing substrates using a variety of different exposure settings. Distortion measurements may be performed periodically (e.g. after exposure of each substrate, after exposure of each lot of substrates, or after some other interval). Alternatively, a FEM model can be used to create a data set with inputs and associated distortion outputs.

The identification of the reticle heating model based on an input data set is an iterative process. As an example, in an embodiment the steps of a single iteration are:

Pre-processing—The data may be polished by removing trends and offsets, to avoid identifying poles on the unit circle or on the origin (discussed further below). Input sequences may be normalized to avoid having to solve ill-conditioned matrices in the subspace identification methods.

Model Order Selection—The selection of the model order may be done by looking at the singular values obtained from the RQ-factorization that is done for the calculation of the A and C matrices. Moreover, model order selection may be performed based on validation results, which allows analysis regarding whether the model has been under-fitted or over-fitted. As described above, the reticle heating model may for example be a 3$^{rd}$ to 5$^{th}$ order model.

Identification—the model is fitted to the data through the use of system identification.

Validation—The model is validated by analyzing how well the identified model caught the dynamics from the dataset. One way in which this may be done is by using a metric referred to as Variance Accounted For (VAF), which may be expressed as follows:

$$VAF(y(k), \hat{y}(k)) = \max\left(0, \left(1 - \frac{\frac{1}{N}\Sigma_{k=1}^{N} \| y(k) - \hat{y}(k) \|_2^2}{\frac{1}{N}\Sigma_{k=1}^{N} \| y(k) \|_2^2}\right) \cdot 100\% \right) \quad (7)$$

where y is the measured distortion, $\hat{y}$ is the predicted signal, k is the sample index and N is the number of samples. The VAF has a value between 0% and 100%, the higher the VAF the lower the prediction error and the better the model. The VAF compares the reticle heating state as predicted by the reticle heating model with the actual measured reticle heating state. By looking at the VAFs of the output from the model, a statement can be made about over-fitting and also about the ability of the model to predict unknown inputs. The validation also looks at residuals, which are calculated as:

$$e(k)=y(k)-\hat{y}(k) \quad (8)$$

where y(k) is the measured output and $\hat{y}$(k) is the output generated by the model. Checking the cross-correlation of the residual to the inputs indicates whether there are any dynamics that were not caught by the model. This could be an indication that the model was under-fitted, i.e. not all reticle heating dynamics are captured by the model. In addition, an auto-correlation of the residuals may be performed to see if there are any other dynamics left in the signal. This could be the result of an influence from an input which has not been provided to the model, or the result of a nonlinear effect. The validation tests are based on the properties:

The sequence e(k) is a zero-mean white-noise sequence, if the identified model explains all the dynamics in y(k).

The sequence e(k) is statistically independent from the input sequence u(k), if all relations between u(k) and y(k) are captured in the identified model.

The above cycle is iterated a plurality of times (e.g. several times) in order to obtain a reticle heating model which satisfactorily captures the dynamics from the data set. In other words, iterations of the cycle are performed until the output from the model reflects sufficiently accurately the distortions which are caused by the reticle heating. That is, until the model correlates the inputs to the measured distortions sufficiently accurately.

To identify a correct model of a system, the data set must contain enough information about the system. For this reason, the data must have been recorded when the system was excited. This is referred to as persistency of excitation.

A check for persistency of excitation may be performed using a Hankel matrix of the inputs to the system. The A and C matrices are extracted from part of the space of this matrix (i.e. a subspace is extracted from the Hankel matrix). To ensure that this subspace can be extracted a Hankel matrix of the inputs is needed which has an order of at least n+s*2, where n is the model order and s the amount of rows in the Hankel matrix. If this is the case then the system is excited enough to make correct estimations of the system. The Hankel matrix for the input u is constructed as follows $$U_{i,s,N} = \begin{bmatrix} u(i) & u(i+1) & \ldots & u(i+N-1) \\ u(i+1) & u(i+2) & \ldots & u(i+N) \\ \vdots & \vdots & \ddots & \vdots \\ u(i+s-1) & u(i+s) & \ldots & u(i+N+s-2) \end{bmatrix} \quad (9)$$

where N is the number of input samples. The model orders (n) used in the identification cycle vary between 1 and 8 (although values larger than 8 are possible).

The processing (noise reduction) is achieved by applying a Kalman filter together with the reticle heating model (although other forms of filter may be used by embodiments of the invention). The Kalman filter for a system of the type set out in Equations (1) and (2) is generally used to optimally observe the states of the system through its measured inputs and outputs, where the real system is known (system matrices given). Here, optimal means that it gives a zero mean estimate with minimal variance. Moreover, because the signal generating system is assumed to be time-invariant, the Kalman filter is stationary and can be expressed as a gain K, also referred to as the Kalman-gain. Information relating to the Kalman filter may be found in M. Verhaegen and V. Verdult, Filtering and System Identification. Cambridge University Press, 2007. Cambridge Books Online.

The following model, which may be referred to as an innovation predictor model, is used:

$$\hat{x}(k+1)=A\hat{x}(k)+Bu(k)+K(y(k)-C\hat{x}(k)-Du(k)) \quad (11)$$

$$\tilde{y}(k)=C\hat{x}(k)+Du(k) \quad (12)$$

in which $\hat{x}$ is the state vector, u is the inputs to the model (discussed above), y is the measured reticle state descriptor (i.e. measured aberrations which may be expressed as Zernike coefficients), $\tilde{y}$ is the reticle state descriptor output from the model (i.e. estimated distortion), and k is the sample index. K is the Kalman gain of the system. Equation (11) describes how the state vector is updated by the model using the measured distortion. Thus, the state of the reticle is determined by the model, including using the measured distortion as an input. Equation (12) describes how the state vector is translated into estimated distortion. Thus, the innovation predictor relates the reticle heating model state $\hat{x}$ to the estimated distortion $\tilde{y}$.

Using the estimated joint covariance matrix, Equation (3), the Kalman gain can be calculated by solving the Discrete Algebraic Riccati Equation (DARE)

$$P=APA^T+Q-(S+APC^T)(CPC^T+R)^{-1}(S+APC^T)^T \quad (13)$$

$$K=(S+APC^T)(CPC^T+R)^{-1} \quad (14)$$

where P is the variance on the error between the real state and the estimated state through the predictor model. A & C are the system matrices which follow from the identification process. Q, S & R are elements of the joint covariance matrix.

The innovation predictor model based on the reticle heating model from Equations (10) and (11) is used with the calculated Kalman-gain to reduce noise on the reticle state description (processing the measured distortion values using the model and the Kalman-gain provides estimated distortion values with reduced noise). This may be referred to as the reticle heating model noise filter.

Hereinabove, the use of mode shapes to express the distortion of a reticle caused by reticle heating has been described. By using mode shapes to describe a relationship between distortions of the reticle and reticle heating input parameters, such as radiation dose, transmission, cooling dose etc., the distortion caused by reticle heating at a location of interest on the reticle can be determined more accurately and/or more efficiently.

In a conventional method, reticle alignment is based on the measurement of distortions of alignment marks on the edge of the reticle, i.e. outside the image field. The measurement of the alignment marks is carried out by an alignment mark measurement method, for example PARIS or TIS. The distortions measured at the alignment marks are used to fit polynomials on the distortions. The polynomials are then used to interpolate distortions over the whole reticle field, in particular locations of interest within the image field. The coefficients of these polynomials are called k-parameters.

Because the actual distortion is only measured at a limited amount of discrete points on the edge of the reticle, i.e. at the alignment marks, and because the distortions within the image field can have complicated shapes, it is often not possible to fit enough k-parameters to describe the complicated shapes sufficiently in order to estimate the distortion at a location of interest within the image field sufficiently accurate. Thereby, it is remarked that the k-parameters have no physical relevance.

As a consequence of the relatively inaccurate fitting of the polynomials, the reticle alignment method, using this conventional method cannot sufficiently accurately predict and correct all distortions in the image field. To improve the results of this method additional alignment marks at the edge of the reticle may be used. However, the use of these additional alignment marks has a negative impact on throughput of the lithographic apparatus, since the additional alignment marks require additional measurement time to measure distortions at the respective additional alignment marks.

Since reticle heating has a dominant effect in the cause of distortions of a reticle, the use of a reticle heating model that uses mode shapes in order to describe the distortions caused by input parameters that cause reticle heating, may substantially improve the estimation of distortions of a reticle at any location of interest on the reticle. As a result thereof, the additional alignment marks along the edge of the reticle in order to improve distortion estimation are no longer required in order to obtain a substantially corresponding overlay performance. This has a substantially positive effect on the throughput of the lithographic apparatus and/or the reticle alignment accuracy can be improved by using the additional marks on the edge.

Another advantage is that the reticle heating model using mode shapes describes an actual physical phenomenon.

It is remarked that the use of a model that describes a relationship between another physical phenomenon caused by known input parameters and a resulting distortion at a location of interest of a reticle, may also be used to predict a distortion of the reticle at the location of interest in order to use the estimated distortion to correct alignment of the reticle.

Figure 4:
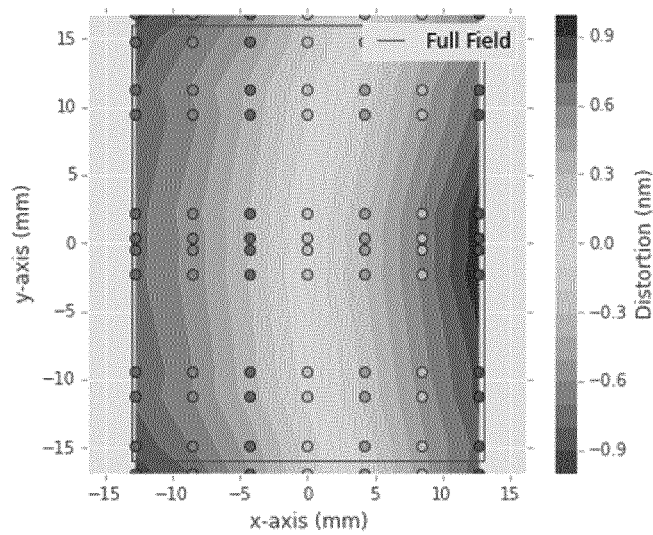
FIGS. 4 and 5 show examples of dominant mode shapes related to reticle heating.
Figure 5:
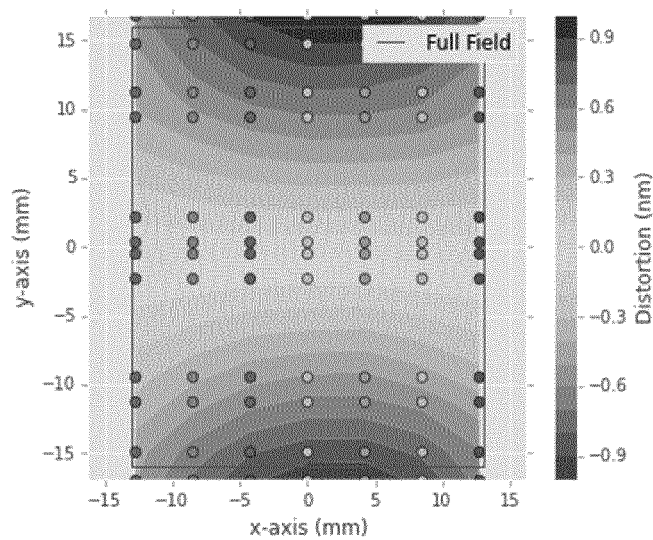

FIGS. 4 and 5 show examples of dominant mode shapes related to reticle heating. FIG. 4 shows a relationship between a normalized reticle heating level and distortions caused in x-direction at locations over the field of the reticle. FIG. 5 shows a relationship between a normalized reticle heating level and distortions caused in y-direction at locations over the field of the reticle. The grayscale in FIG. 4 is to be construed in such a way that the distortions on the left hand side are negative and the distortions on the right hand side are positive. The grayscale in FIG. 5 is to be construed in such a way that the distortions at the top are positive and the distortions at the bottom are negative.

The mode shapes represent spatial relations in the reticle, making it possible to estimate the distortions at each location of interest of the reticle by only knowing the distortions in a small part of the reticle, in particular at the marks of the reticle. The mode shape can for example be described as a normalized vector with each entry representing a distortion for a certain position on the reticle.

As the mode shapes are orthogonal the mode shapes can be fitted to the reticle alignment measurements by projection of the reticle alignments measurements onto the mode shapes. The decomposition of a reticle alignment measurement for a single time instance is as follows:

$$M = c_1 B_1 + c_2 B_2 + \ldots + c_i B_i + \epsilon$$

Where $c_i$ is the gain for the $i^{th}$ mode shape, $B_i$ is the mode shape and $\epsilon$ is the residual left because we fit a finite amount of mode shapes. The mode shape gain is then fitted by $$c_i = \frac{M \cdot B_i}{B_i \cdot B_i}$$

It has been found that that having four mode shapes, thus i=4, two for distortions in x and two for in y, we can fit most of the RH caused distortions out of the measurements.

The reticle heating mode shapes can be obtained on the basis of sensor data and/or simulation data. The simulation data may for instance be generated by a FEM model describing a relationship between reticle heating input parameters and distortions of reticle caused by the reticle heating caused by these input parameters.

In the case of sensor data being used for obtaining mode shapes, measurements may be performed in an expose sequence that resembles a normal lot, only now also the edge marks or even image field marks of the reticle are measured. This results in a dataset; $\{M\}^N$, where N signifies the amount of samples. By making a matrix of $\{M\}^N$, where every vector describes the measurements at a single time instance, the Singular Value Decomposition (SVD) can be applied. The mode shapes can then be extracted from the decomposition as follows:

$$[M_1 \ldots M_N] = [B_1 \ldots B_N] \begin{bmatrix} \sigma_1 & 0 & 0 \\ 0 & \ddots & 0 \\ 0 & 0 & \sigma_N \end{bmatrix} V^T.$$

wherein $B_i$ are mode shapes, $\sigma_i$ are singular values, and V Eigenvectors. It is remarked that although a single time instance is imposed in determination of the matrix $\{M\}^N$, the whole measurement layout may actually not be measured at the same time.

In an example, when using a conventional method fitting k-parameters of polynomials, based on measurements with the measurement layout denoted by the dots in FIGS. 4 and 5, not all reticle heating effects are corrected for in the image field of the reticle. When instead of fitting the k-parameters, dominant reticle heating mode shapes are fitted to the reticle alignment mark measurements, the distortions can be predicted substantially more accurately over the whole image field of the reticle, and therewith the alignment performance of the reticle can be substantially improved. This performance may be further improved by fitting more mode shapes.

Thus, it is concluded that due the use of reticle heating mode shapes, the distortions caused by reticle heating can be predicted more accurately over the whole field of the reticle, i.e. at a location of interest on the reticle. The use of mode shapes also directly relates to a physical effect in the reticle. The improved accuracy of prediction of distortions may for example be used to improve the overlay performance of the lithographic apparatus and/or to decrease the number of alignment mark measurements in order to improve the throughput of the lithographic apparatus. Hereinabove, the use of reticle heating mode shapes has been described for use in a linear time invariant reticle heating models in order to predict distortions caused by inputs that cause reticle heating. It is remarked that the mode shapes may also be used in other models that directly or indirectly predict distortions of a reticle caused by inputs that cause reticle heating or, more generally, inputs that relate to distortions of the reticle.

In an embodiment, there is provided a method of reducing effects of heating and/or cooling of a reticle in a lithographic process, comprising the steps of: calibrating a linear time invariant reticle heating model using a system identification method; predicting distortions of the reticle in the lithographic apparatus using the reticle heating model and inputs in the lithographic process; and calculating and applying a correction in the lithographic process on the basis of the predicted distortions of the reticle.

In an embodiment, calibrating the reticle heating model comprises using data on inputs in the lithographic process and distortions of the reticle. In an embodiment, the distortion is expressed in overlay parameters and/or mode shapes. In an embodiment, the inputs in the lithographic process comprise a dose of radiation supplied by a radiation source and/or a transmission of the object. In an embodiment, the inputs in the lithographic process comprise a cooling dose supplied by an adaptive reticle cooling system. In an embodiment, the reticle heating model is a state space model. In an embodiment, the calibration data comprises measurement data, process data, or data obtained from other reticle heating models such as an FEM model. In an embodiment, the reticle heating model is calibrated for a single reticle and/or for a specific type or group of reticles having a substantially corresponding behavior. In an embodiment, the reticle heating model is used to calculate an observer. In an embodiment, the correction is applied between subsequent projections with the same reticle. In an embodiment, the correction is a correction of an alignment of a substrate with respect to the reticle to improve imaging performance in the lithographic process. In an embodiment, the reticle heating model comprises one or more mode shapes describing a relationship between inputs and distortions resulting from the inputs.

In an embodiment, there is provided a computer program comprising computer readable instruction configured to cause a processor to carry out a method as described herein. In an embodiment, there is provided a computer readable medium carrying a computer program as described herein.

In an embodiment, there is provided a lithographic apparatus comprising: an illumination system configured to condition a radiation beam; a support constructed to support a reticle, the reticle being capable of imparting the radiation beam with a pattern in its cross-section to form a patterned radiation beam; a substrate support constructed to support a substrate; and a projection system configured to project the patterned radiation beam onto a target portion of the substrate, wherein the lithographic apparatus comprises a control system arranged to reduce effects of heating and/or cooling of a reticle in a lithographic process by: calibrating a linear time invariant reticle heating model using a system identification method; predicting distortions of the reticle using the reticle heating model and inputs in the lithographic process; and calculating and applying a correction in the lithographic process on the basis of the predicted distortions of the reticle.

In an embodiment, there is provided a device manufacturing method using a lithographic process comprising: patterning a projection beam with a pattern in its cross-section using a reticle; projecting the patterned beam of radiation onto a target portion of a substrate using a projection system, wherein the method further comprises the steps of: calibrating a linear time invariant reticle heating model using a system identification method; predicting distortions of the reticle using the reticle heating model and inputs in the lithographic process; and calculating and applying a correction in the lithographic process on the basis of the predicted distortions of the reticle.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A method of reducing effects of heating and/or cooling of a reticle in a lithographic process, the method comprising:
   calibrating a linear time invariant reticle heating model;
   predicting distortions of the reticle in a lithographic apparatus using the reticle heating model and inputs in the lithographic process; and
   calculating and applying a correction in the lithographic process on the basis of the predicted distortions of the reticle,
   wherein the distortion is expressed in one or more overlay parameters and/or one or more mode shapes.

2. The method of claim 1, wherein calibrating the reticle heating model comprises using data on inputs in the lithographic process and distortions of the reticle.

3. The method of claim 1, wherein the inputs in the lithographic process comprise a dose of radiation supplied by a radiation source and/or a transmission of an object used in the lithographic process.

4. The method of claim 1, wherein the inputs in the lithographic process comprise a cooling dose supplied by an adaptive reticle cooling system.

5. The method of claim 1, wherein the reticle heating model is a state space model.

6. The method of claim 5, wherein the calibrating uses measurement data, process data, or data obtained from another reticle heating model.

7. The method of claim 1, wherein the reticle heating model is calibrated for a single reticle and/or for a specific type or group of reticles having a substantially corresponding behavior.

8. The method of claim 1, wherein the reticle heating model is used to calculate an observer.

9. The method of claim 1, wherein the correction is applied between subsequent projections with the same reticle.

10. The method of claim 1, wherein the correction is a correction of an alignment of a substrate with respect to the reticle to improve imaging performance in the lithographic process.

11. The method of claim 1, wherein the reticle heating model comprises one or more mode shapes describing a relationship between inputs and distortions resulting from the inputs.

12. A non-transitory computer readable medium comprising computer readable instructions configured to cause a processor system to at least:
    calibrate a linear time invariant reticle heating model;
    predict distortions of a reticle in a lithographic apparatus using the reticle heating model and inputs in a lithographic process; and
    calculate and apply a correction in the lithographic process on the basis of the predicted distortions of the reticle,
    wherein the distortion is expressed in one or more overlay parameters and/or one or more mode shapes.

13. The computer readable medium of claim 12, wherein the reticle heating model comprises one or more mode shapes describing a relationship between inputs and distortions resulting from the inputs.

14. A lithographic apparatus comprising:
    an illumination system configured to condition a radiation beam;
    a support constructed to support a reticle, the reticle being capable of imparting the radiation beam with a pattern in its cross-section to form a patterned radiation beam;
    a projection system configured to project the patterned radiation beam onto a target portion of a substrate; and
    a control system arranged to reduce effects of heating and/or cooling of a reticle in a lithographic process, the control system configured to at least:
      calibrate a linear time invariant reticle heating model;
      predict distortions of the reticle using the reticle heating model and inputs in the lithographic process; and
      calculate and apply a correction in the lithographic process on the basis of the predicted distortions of the reticle,
      wherein the distortion is expressed in one or more overlay parameters and/or one or more mode shapes.

15. The apparatus of claim 14, wherein the reticle heating model is a state space model.

16. The apparatus of claim 14, wherein the reticle heating model is used to calculate an observer.

17. The apparatus of claim 14, wherein the reticle heating model comprises one or more mode shapes describing a relationship between inputs and distortions resulting from the inputs.

18. A device manufacturing method using a lithographic process, the device manufacturing method comprising:
   patterning a projection beam with a pattern in its cross-section using a reticle;
   projecting the patterned beam of radiation onto a target portion of a substrate using a projection system; calibrating a linear time invariant reticle heating model;
   predicting distortions of the reticle using the reticle heating model and inputs in the device manufacturing method; and
   calculating and applying a correction in the device manufacturing method on the basis of the predicted distortions of the reticle,
   wherein the distortion is expressed in one or more overlay parameters and/or one or more mode shapes.

19. The method of claim 18, wherein the reticle heating model is a state space model.

20. The method of claim 18, wherein the reticle heating model is used to calculate an observer.

\* \* \* \* \*